(12) United States Patent
Van Hoof et al.

(10) Patent No.: US 6,653,163 B2
(45) Date of Patent: Nov. 25, 2003

(54) DEVICE FOR EMITTING ELECTROMAGNETIC RADIATION AT A PREDETERMINED WAVELENGTH AND A METHOD OF PRODUCING SUCH DEVICE

(75) Inventors: Chris Van Hoof, Leuven (BE); Hans De Neve, Turnhout (BE); Gustaaf Borghs, Kessel-Lo (BE)

(73) Assignee: IMEC, Leuven (BE)

( * ) Notice: Subject to any disclaimer, the term of this patent is extended or adjusted under 35 U.S.C. 154(b) by 72 days.

(21) Appl. No.: 09/789,954

(22) Filed: Feb. 20, 2001

(65) Prior Publication Data

US 2002/0000559 A1 Jan. 3, 2002

Related U.S. Application Data

(62) Division of application No. 09/070,455, filed on Apr. 30, 1998, now Pat. No. 6,191,431.

(30) Foreign Application Priority Data

Apr. 30, 1997 (EP) ............................................. 97870062
May 29, 1997 (EP) ............................................. 97870077

(51) Int. Cl.[7] ............................................. H01L 21/00
(52) U.S. Cl. ............................................. 438/47
(58) Field of Search ............................. 257/94; 438/46, 438/47

(56) References Cited

U.S. PATENT DOCUMENTS

| 5,089,860 A | 2/1992 | Deppe et al. |
| 5,841,126 A | 11/1998 | Fossum |
| 5,877,509 A | 3/1999 | Pau et al. |
| 6,057,560 A | * 5/2000 | Uchida ........................ 257/94 |
| 6,191,431 B1 | 2/2001 | Hoof et al. |

FOREIGN PATENT DOCUMENTS

| EP | 473 983 | 3/1992 |
| EP | 550 963 | 7/1993 |
| GB | 2324651 | 10/1998 |

OTHER PUBLICATIONS

Teissier et al., "Electroluminescence spectroscopy in a high field of the ballistic–electron energy distribution in single-–barrier heterostructures" Physical Review B, Feb. 15, 1995 vol. 51, No. 8, pp 5562–5565.*

Finley, J.J. et al., An Optical and Electrical Study of Tunnelling Mechanisms Through Indirect Gap Single Barrier GaAs/AlAs/GaAs Heterostructures:. 11th International Conference on the Electronic Properties of Two–Dimensional Systems, Nottingham, UK. Aug. 7–11, 1995, vol. 361–362, ISSN 0039–6028, Surface Science, Jul. 20, 1996, Elsevier, Netherlands, pp. 197–200.

(List continued on next page.)

Primary Examiner—William David Coleman
(74) Attorney, Agent, or Firm—Knobbe, Martens, Olson & Bear, LLP

(57) ABSTRACT

A device for emitting radiation at a predetermined wavelength is disclosed. The device has a cavity comprising a first bulk region and a second bulk region of opposite conductivity type wherein a barrier is provided for spatially separating the charge carriers of the first and the second region substantially at the antinode of the standing wave pattern of said cavity. The recombination of the charge carriers at the barrier create radiation, the emission wavelength of the radiation being determined by the cavity.

4 Claims, 10 Drawing Sheets

OTHER PUBLICATIONS

Teissier R. et al., "Experimental Determination of Gamma–X Intervalley Transfer Mechanisms in GaAs/A1As Heterostructures", *Physical Review*, vol. 54, No. 1215 Sep. 1996, pp. R8329–R–8332.

European Search Report dated Oct. 15, 1998.

Hunt, N.E.J., et al., "Extremely Narrow Spectral Widths From Resonant Cavity Light–Emitting Diodes (RCLEDs) Suitable for Wavelength–Division Multiplexing at 1.3 um and 1.55 um", *IEEE*, Dec. 13, 1992, pp. 26.3.1–26.3.4.

Huffaker, D.L. et al., "Fabrication of High–Packing–Density Vertical Cavity Surface–Emitting Laser Arrays Using Selective Oxidation", *IEEE Photonics Technology Letters*, vol. 8, No. 5, May 1996, pp. 596–598.

D.G. Deppe, et al., "Optically–coupled mirror–quantum well InGaAs–GaAs light emitting diode", Electron Lett. 26 (20), pp. 1665–1666 (1990).

T. Yamauchi, et al., "Enhanced and inhibited spontaneous emission in GaAs/AlGaAs vertical microcavity lasers with two kinds of quantum wells", Appl. Phys. Lett. 58 (21), pp. 2339–2341 (1991).

T.J. de Lyon, et al., "Doping concentration dependence of radiance and optical modulation bandwidth in carbon–doped $Ga_{0.51}In_{0.49}P$/GaAs light–emitting diodes grown by gas source molecular beam epitaxy", Appl. Phys. Lett. 60 (3), pp. 353–355 (1992).

M. Ettenberg, et al., "Linear, High–Speed, High–Power Strained Quantum–Well LCD's", IEEE Photon. Technol. Lett. 4 (1), pp. 27–28 (1992).

H. De Neve, et al., "High Efficiency Planar Microcavity LED's: Comparison of Design and Experiment", IEEE Photon. Technol. Lett. 7, pp. 287–289 (1995).

E.F. Schubert, et al., "Temperature and Modulation Characteristics of Resonant–Cavity Light Emitting Diodes", Journal of Lightwave Technology, 14 (7), pp. 1721–1729 (1996).

* cited by examiner

DEVICE FOR EMITTING ELECTROMAGNETIC RADIATION AT A PREDETERMINED WAVELENGTH AND A METHOD OF PRODUCING SUCH DEVICE

REFERENCE TO PRIOR APPLICATION

This application is a Divisional of prior application Ser. No. 09/070,455 filed Apr. 30, 1998, now U.S. Pat. No. 6,191,431 issued Feb/ 20, 2001.

BACKGROUND OF THE INVENTION

1. Field of the Invention

The present invention is related to the field of devices emitting electromagnetic radiation. More in particular, a semiconductor device that emits radiation at a predetermined wavelength is disclosed. A method of producing such device and applications of such device are also disclosed.

2. Description of the Related Art

Semiconductor devices that can emit non-coherent or coherent electromagnetic radiation are known in the art. A number of publications on semiconductor based electromagnetic radiation emitters deals with Light Emitting Diodes (LEDs) or Microcavity LEDs or Microcavity Lasers or Vertical Cavity Surface Emitting Lasers. Examples of such publications are:

- H. De Neve, J. Blondelle, R. Baets, P. Demeester, P. Van Daele, G. Borghs, IEEE Photon. Technol. Lett. 7 287 (1995);
- E. F. Schubert, N. E. J. Hunt, R. J. Malik, M. Micovic, D. L. Miller, "Temperature and Modulation Characteristics of Resonant-Cavity Light-Emitting Diodes", Journal of Lightwave Technology, 14 (7), 1721–1729 (1996);
- T. Yamauchi and Y. Arakawa, Enhanced and inhibited spontaneous emission in GaAs/AlGaAs vertical microcavity lasers with two kinds of quantum wells. Appl. Phys. Lett. 58 (21), 2339 (1991);
- T. J. de Lyon, J. M. Woodall, D. T. McInturff, R. J. S. Bates, J. A. Kash, P. D. Kirchner, and F. Cardone, "Doping concentration dependence of radiance and optical modulation bandwidth in carbon-doped $Ga_{0.1}In_{0.49}P$/GaAs light-emitting diodes grown by gas source molecular beam epitaxy" Appl. Phys. Lett. 60 (3), 353–355 (1992);
- D. G. Deppe, J. C. Campbell, R. Kuchibhotla, T. J. Rogers, B. G. Streetman, "Optically-coupled mirror-quantum well InGaAs-GaAs light emitting diode", Electron. Lett. 26 (20), 1665 (1990);
- M. Ettenberg, M. G. Harvey, D. R. Patterson, "Linear, High-Speed, High-Power Strained Quantum-Well LED's", IEEE Photon. Technol. Lett. 4 (1), 27 (1992);
- U.S. Pat. No. 5,089,860 Depew, et al. Feb. 18, 1992, "Quantum well device with control of spontaneous photon emission, and method of manufacturing same";
- EP-0550963 of Cho, et al "An Improved Light Emitting Diode".

The presence of a combination of critical parameters in the fabrication of Vertical Cavity Surface Emitting Lasers (VCSELs) makes such lasers suffer from non-uniformity effects over an epitaxially-grown wafer. Examples of parts of said VCSELs with critical parameter values are the two distributed Bragg Reflectors (DBRs), the cavity thickness and the thickness of the quantum well (i.e. the active region). This problem so far has limited array-production of operational VCSELs to 8*8 arrays. An 8*8 VCSEL array was disclosed in the publication "Fabrication of High-Packaging Density Vertical Cavity Surface-Emitting Laser Arrays Using Selective Oxidation" IEEE Phot. Techn. Lett. 8, 596 (1996), by Huffaker et al. Furthermore, the high current density needed for efficient operation of lasers (due to the threshold current needed for achieving inversion) limits the simultaneous operation of many laser elements in array applications. In addition, though VCSELs allow high-speed small-signal modulation, VCSELs cannot be used efficiently for high-speed large-signal modulation due to the presence of a threshold current.

The development of Microcavity light-emitting diodes ($\mu$ cavity LEDs) has created efficient and spectrally-narrow semiconductor light sources other than lasers in general and VCSELs in particular. In contrast to lasers, $\mu$ cavity LEDs do not suffer from any threshold behavior. State-of-the-art Microcavity LEDs have only one DBR, a wavelength cavity and one or more quantum wells that need to be matched in thickness, making design and production less critical. The absence of a threshold in Microcavity LEDs results in far lower current densities being required for array applications. The increased electrical to optical power efficiency of state-of-the-art $\mu$ cavity LEDs as compared to conventional LEDs improves the applicability of these $\mu$cavity LEDs in applications such as optical interconnection systems (in particular as arrays of electromagnetic radiation-emitters) and display applications and systems that are critical on the power budget. State-of-the-art $\mu$cavity LEDs use one or more quantum wells in the center of the cavity (see FIG. 1) that all have to be identical and matched to the cavity wavelength. Electrons and holes flow from opposite sides into the quantum wells and recombine. Switch-on and switch-off of the $\mu$cavity LEDs are in essence radiative recombination time limited or RC time constant limited depending on which one is shorter. The use of several quantum wells has proven to be essential to reduce saturation in one quantum well, but moves the carrier localization away from the localization at the anti-node of the standing-wave pattern in the cavity. The use of several quantum wells also slows the response and the switch-on and switch-off of the $\mu$cavity LEDs.

However, for array production of $\mu$ cavity LEDs, as for instance for optical interconnects, non-uniformities in the growth of these $\mu$ cavity LED and the signal modulation speed remain critical issues. In the design of $\mu$ Cavity LEDs one makes use of a quantum well to ensure carrier recombination at the center of the cavity standing-wave pattern (see H. De Neve, J. Blondelle, R. Baets, P. Demeester, P. Van Daele, and G. Borghs in IEEE Photon. Technol. Lett. 7, 287 (1995)). In the design of other state-of-the-art $\mu$ cavity LEDs such as disclosed by J. Blondelle, H. De Neve, P. Demeester, P. Van Daele, G. Borghs and R. Baets in El. Lett. 31, 1286 (1995) three quantum wells were used to boost efficiency. In said publication, the efficiency of a $\mu$ cavity LED is boosted by preventing saturation, at the cost of moving part of the active layer away from the localization at the anti-node of the standing-wave pattern in the cavity making the efficiency enhancement less pronounced. Thickness variations of the quantum well across a sample move the emission wavelength in the different area's of the sample away from the cavity wavelength which reduces the external efficiency. Furthermore, this device requires the thickness of the quantum well to be exactly matched to the wavelength of the cavity.

Ultra-high speed modulation in semiconductor-based electromagnetic radiation emitting devices in prior art publications so far was disclosed only for VCSELs or inefficient LEDs. T. J. de Lyon, J. M. Woodall, D. T. McInturff, R. J. S. Bates, J. A. Kash, P. D. Kirchner, and F. Cardone, in "Doping concentration dependence of radiance and optical modulation bandwidth in carbon-doped $Ga_{0.1} In_{0.49}P/GaAs$ light-emitting diodes grown by gas source molecular beam epitaxy" Appl. Phys. Lett. 60 (3), 353–355 (1992) disclose a method of making high-speed LEDs by highly doping the active region of the LED, which leads to fast non-radiative recombination and hence a high-speed response of the LED. The resulting gain in speed however is more than compensated by a reduction in quantum efficiency which is incompatible with its use in arrays.

EP-0473983 discloses a light emitting device, the device concept of which uses cavity quantum electrodynamics. This device concept is based in the presence of a quantum well layer adjacent to a barrier layer. The device concept of EP-0473983 suffers a.o. from the problems of:

limited power performance;

slow switch-off time; and emission wavelength shift during operation.

Aim of the Invention

It is an aim of the present invention to provide a semiconductor-based device emitting electromagnetic radiation, which has a high quantum efficiency, and wherein the precise thickness of the layers composing the device are not critical. The fact that the thicknesses of the layers composing the device are not critical will allow higher yield in growing the structures and higher yield across a wafer. The absence of carrier trapping phenomena in the device according to the invention allows fast charge separation and thus leads to ultra-high-speed, large-signal modulation previously only observed in VCSELs or inefficient LEDs.

The present invention removes the critical thickness of the quantum well (or more quantum wells) of prior art light-emitting devices by replacing it with a bulk layer or a bulk structure, so as to ensure homogenous efficiency over a larger array of devices over a wafer. To ensure no loss in external efficiency, carrier localization at the anti-node of the standing-wave pattern in the cavity is obtained by the addition of a barrier layer with non-critical thickness. This leads to an electromagnetic radiation emitting device with very high external efficiency and with a minimal variation in device characteristics when an array of devices is formed on one semiconductor wafer.

SUMMARY OF THE INVENTION

A device for emitting electromagnetic radiation at a predetermined wavelength is disclosed, said device having a cavity comprising a first bulk region of one conductivity type and a second bulk region of opposite conductivity type and wherein a barrier is provided for spatially separating the charge carriers of said first and said second bulk region, said barrier being near the antinode of the standing wave pattern of said cavity, the recombination of the charge carriers of the different conductivity types at/across the barrier creating said radiation. The emission wavelength of said radiation is affected or influenced by said cavity. Said first bulk region is adjacent to and abuts said barrier. Said second bulk region is adjacent to and abuts said barrier. With bulk region, it is meant a region of sufficient thickness for having the quantisation effects on the charge carriers being negligibly and much smaller than the thermal energy (kT) of the charge carriers. Thus, the quantisation effects of a bulk region are not measurable in the emission of the radiation and these effects have no impact compared to the line width of the emitted wavelength. Thus, such bulk region, e.g. is not a quantum well. Said barrier can be a third region in said cavity providing a barrier for transport of said charge carriers in-between said first and said second region, the charge carriers of one conductivity type thereby being trapped at one side of said barrier in either one of said first or second regions, the charge carriers of the other conductivity type being injected from the other side of said barrier, the recombination of the charge carriers of the different conductivity type creating said radiation.

The device can further comprise a mirror being provided on the surface of one of said first or said second region; and a mirror or semi-transparent mirror being provided on the surface of another of said first or said second region. An array of such devices can be made wherein said devices are provided on one substrate. Said first and said second regions can each consist in essentially a first material with a first bandgap, the third region consisting essentially in a third material with a third bandgap.

In an alternative embodiment of the present invention, said first and said second regions consist in essentially a first material and essentially a second material respectively with a first and a second bandgap respectively. The first region and the second region in both embodiments can also comprise layers of a fourth or fifth or further materials.

The cavity can be a single wavelength cavity, a so-called $\lambda$-cavity. The cavity can also be a so-called $n\lambda$-cavity. These terms $\lambda$-cavity and $n\lambda$-cavity are well-known in the art, such a cavity being also well-known in the art.

Further is disclosed a method of producing a device for emitting electromagnetic radiation at a predetermined wavelength, comprising the steps of: depositing a first layer including a first material with a first bandgap and having a refractive index $n_1$ and with charge carriers of a first conductivity type on a substrate; depositing a third layer of a third material with a third bandgap on said first layer, said third bandgap being larger than said first bandgap; and depositing a second layer of substantially the same thickness as said first layer on said third layer, said second layer being provided with charge carriers of a second conductivity type, the total thickness of said first and said second regions having a value of about said predetermined wavelength divided by $n_1$; while maintaining during said deposition steps at least one surface of said first layer and one surface of said second layer essentially parallel. The method can further comprise the step of depositing a mirror layer on said substrate.

DETAILED DESCRIPTION OF THE INVENTION

The present invention is described in detail in the sequel in relation to the appended drawings. Several embodiments, including a preferred embodiment are disclosed. It is apparent, however, that the person skilled in the art can imagine several other equivalent embodiments or other ways of practicing the present invention, the spirit and scope thereof being limited only by the terms of the appended claims.

A preferred embodiment of the present invention, involves a device for emitting electromagnetic radiation at a predetermined wavelength. The device has a first and a second region of substantially the same thickness each consisting essentially in a first material with a first bandgap and having a refractive index $n_1$, the first region has charge carriers of a first conductivity, and the second region has charge carriers of a second conductivity type. The total thickness of the first and the second region has a value of about the predetermined wavelength divided by $n_1$. At least one surface of the first region and one surface of the second region are essentially parallel; the device further has a third region consisting essentially of a third material with a third bandgap in-between the first and the second region, the third bandgap being larger than the first bandgap. The total precise thickness of the first and the second regions and the thickness of the third region are determined according to a calculation optimizing these different thicknesses depending on the choice of the materials and radiation efficiency constraints according to the principles of the invention.

The device of the preferred embodiment is provided on a substrate, the substrate consisting essentially of the first material, the first and second and third regions being in an epitaxial relationship one with another. According to the preferred embodiment, the first material and the third material are selected from the group of III–V semiconducting materials, the radiation being electromagnetic radiation, the specific wavelength of the electromagnetic radiation being dependent on the specific III–V material. In the case that the first material is GaAs, the emission wavelength will be in the range of 820 to 900 nm and about 855 nm. In the case that the first material is AlGaAs, the emission wavelength will be in the range of 700 to 865 nm. In the case that the first material is InGaAs, the emission wavelength will be in the range of 855 to 900 nm. In the case that the first material is InAs, the initial wavelength will be in the range of 3500 nm. The charge carriers of the first conductivity type are electrons or holes, and the charge carriers of a second conductivity type are holes or electrons respectively.

Figure 1:
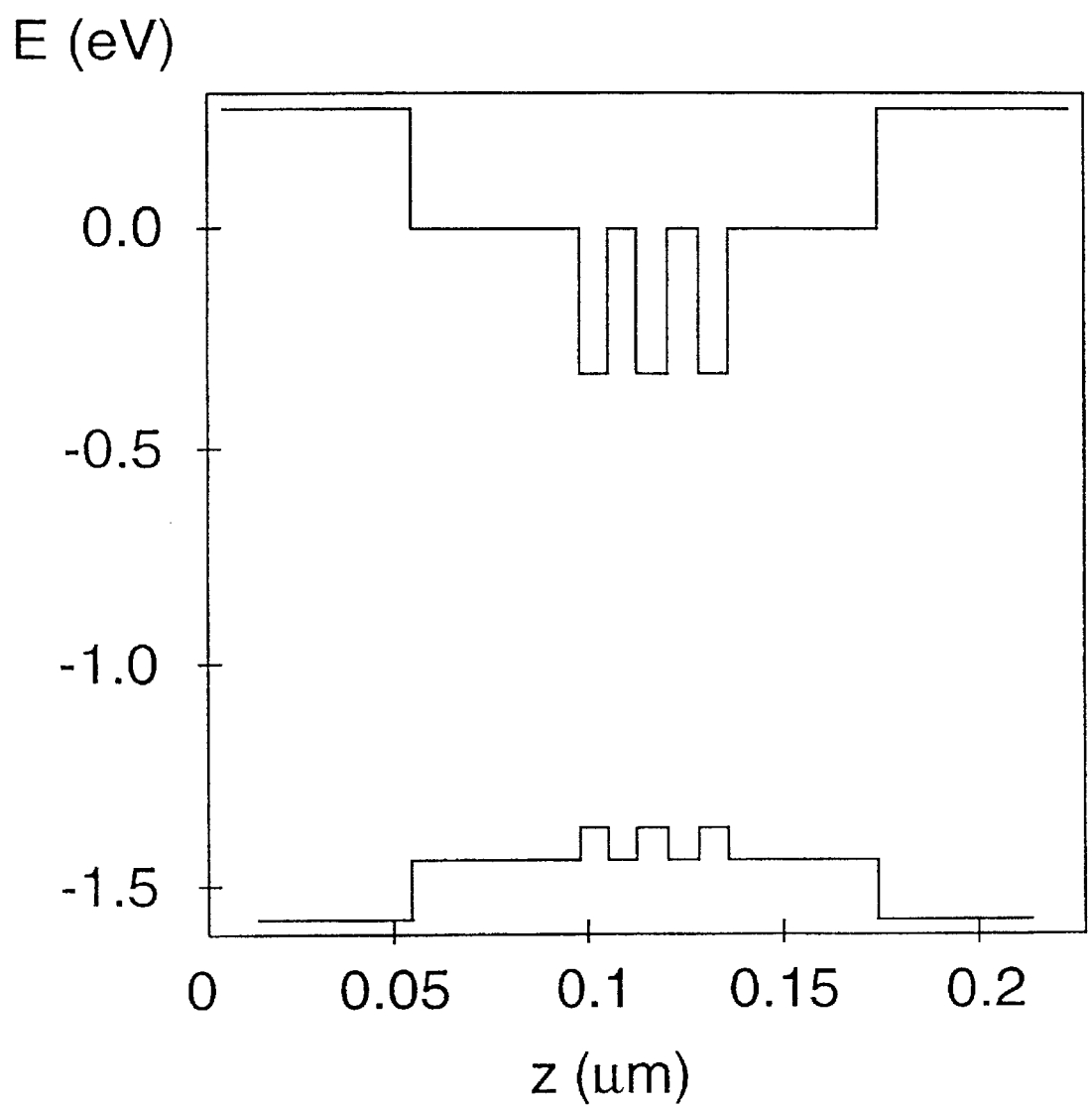
FIG. 1 shows the band diagram of a state-of-the-art $\mu$cavity LED device for achieving high external efficiency.
Figure 2:
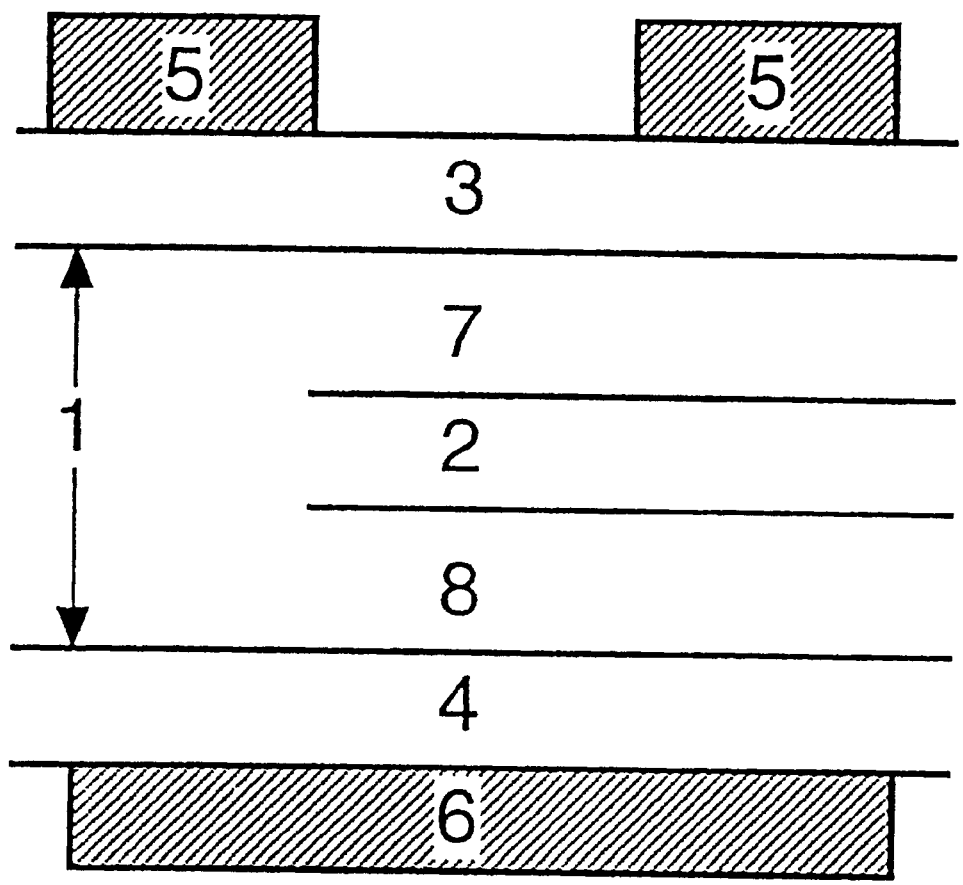
FIG. 2 shows a schematic cross-sectional view of an electromagnetic radiation-emitting device according to an embodiment of the present invention.

FIG. 2 shows a preferred embodiment of the present invention. A GaAs electromagnetic radiation-emitting device is provided. This electromagnetic radiation-emitting device emits electromagnetic radiations at a predetermined wavelength λ. λ is preferably in the range of 820 to 900 nm, the bulk emission wavelength of n-doped GaAs being 855 nm. This device comprises a conductive bottom mirror (4). The conductive bottom mirror (4) can be fabricated to reflect or have a predetermined emission wavelength in the range of about 820 to about 900 nm. Alternatively, this broad wavelength range mirror (4) can be a Distributed Bragg Reflector (DBR) or a metallic mirror. The semiconductor electromagnetic radiation-emitting device further comprises a wavelength (λ)-cavity (1) being made of GaAs, with a thin AlAs layer (2) at the antinode of the standing-wave pattern in the wavelength-cavity (1) (in this case the center of the cavity). The thickness of the AlAs layer (2) can be about 6 to 8 nm; in general the layer in the center of the cavity should be sufficiently thin to allow for tunnelling or for thermo-ionic emission of charge carriers (electrons or holes) through the layer. The charge carriers in the GaAs layers (7, 8) of the λ-cavity (1) on either side of the AlAs layer (2) are to be of the opposite type. For example, the GaAs can be doped with Si-atoms, forming n-type charge carriers (electrons) or with Be-atoms, forming p-type charge carriers (holes). In an alternate embodiment, AlGaAs can be used as a top layer on top of each GaAs layer to reduce the absorption of the cavity, which in turn results in more efficient emission. In such case, an AlGaAs layer and a GaAs layer constitute together the first region and the second region. The wavelength cavity is to have a thickness in this first embodiment of the invention of about 250 nm (λ divided by the refractive index of GaAs). The electromagnetic radiation-emitting device further comprises a conductive top mirror (3). The conductive top mirror (3) can be the GaAs/transparent contact interface or again a DBR. It can also be a $AlO_x$/GaAs mirror structure. Ohmic contacts (5, 6) can further be provided to either mirror (3, 4).

Figure 3:
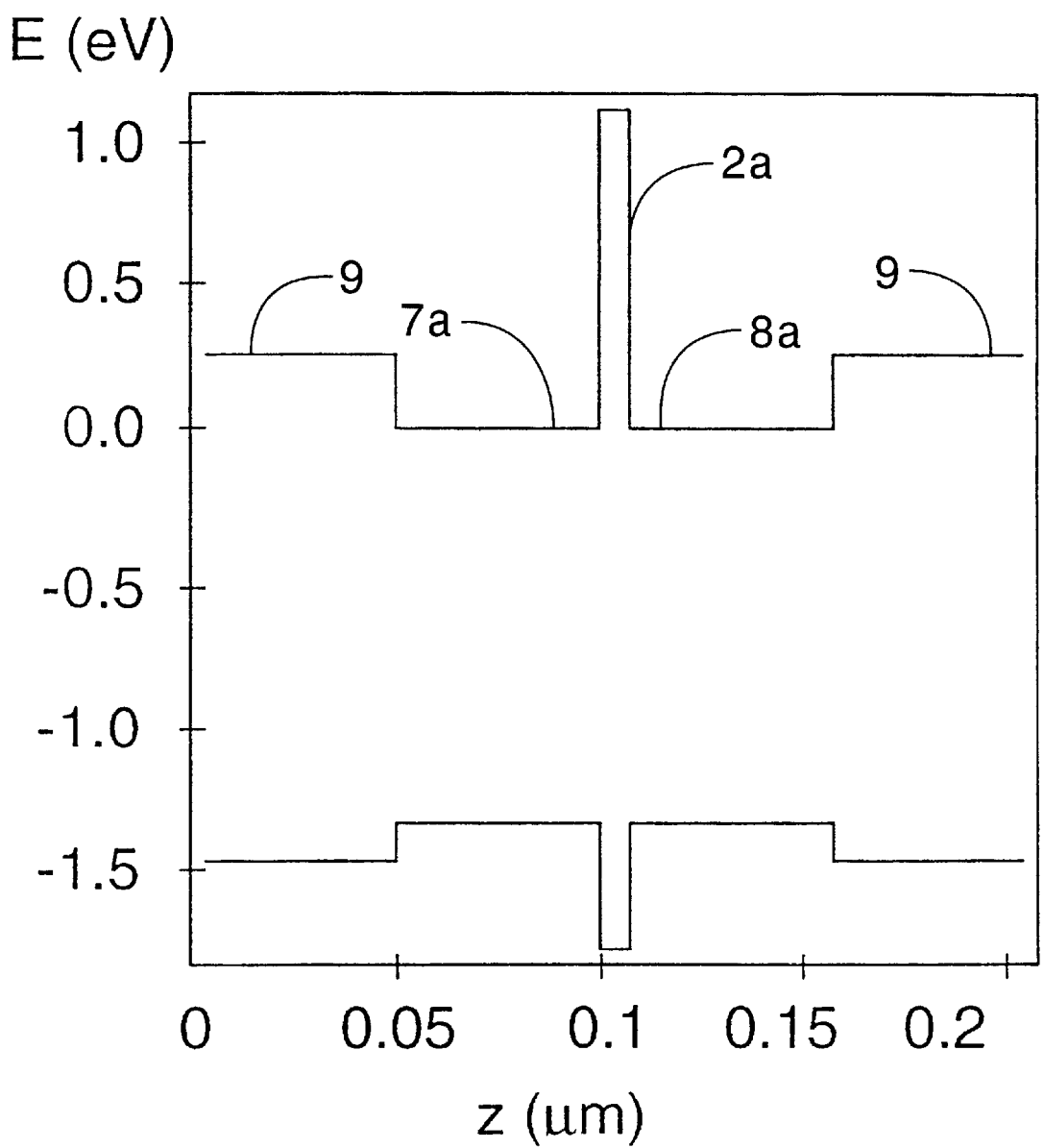
FIG. 3 shows part of the band diagram of the electromagnetic radiation-emitting device according to an embodiment of the present invention.

FIG. 3 depicts a part of an exemplary band diagram for an exemplary embodiment of the present inventor. The band diagram reflects the bands (7a, 8a) for the first and second regions (7, 8) and the band (2a) corresponding to the barrier layer (2). The band diagram also depicts wider bands 9 which correspond to layers reducing the absorption of the cavity, as explained above.

In a second embodiment, the semiconductor electromagnetic radiation-emitting device is deposited on a GaAs substrate. Possibly, the structure can be grown by molecular beam epitaxy. A typical growth comprises the following layers.

(i) A bottom mirror, preferably a Distributed Bragg Reflector (DBR) reflecting the desired emission wavelength λ. This DBR is a stack of λ/4 GaAs and AlAs layers (or AlGaAs/AlAs layers) in this embodiment, but can be any material consisting of λ/4 layers of two materials with a different index of refraction;

(ii) An AlGaAs λ-cavity with a thin AlAs layer in the center of the cavity (i.e. at the maximum of the standing-wave pattern for the wavelength of the cavity).

(iii) A top mirror consisting of the AlGaAs/air interface. This mirror could also be a thin metallic film, or a DBR or an $AlO_x$/GaAs structure.

(iv) A transparent Indium Tin Oxide (ITO) contact is sputtered on the sample using photolithographically-defined mesas. This transparent Indium Tin Oxide (ITO) film is used as an ohmic contact. In principle, any ohmic contact ring could also be used provided it covers a sufficiently small area of the sample to allow for electromagnetic radiation emission when using ITO mesas. Mesas can be defined without additional lithography using wet chemical etching. The current state-of-the-art mesa etch stops 10–40 nm above the active layer to minimize surface recombination effects.

In an example of the invention, as detailed below, the samples are grown by molecular beam epitaxy on n+ (Si)-doped GaAs substrates and comprise a n+ (3eE18 cm-3) GaAs buffer layer (approximately 600 nm), a Distributed Bragg Reflector (DBR) consisting of 10 periods (58.2 nm GaAs/ 71.1 nm AlAs) n+ (3E18 cm-3), i.e. λ/4 layers for the desired wavelength of operation, followed by a wavelength cavity. The wavelength cavity consists of a 62 nm n+ (3E18 cm-3) doped AlGaAs optimalization light-output Al0.3Ga0.7As cladding/bottom contact layer followed by a 25 nm (3E18 cm-3) GaAs bottom contact layer, a 20 nm GaAs (1E17 cm-3) spacer layer, a 5 nm undoped GaAs spacer layer, a 8 nm undoped AlAs barrier layer, a 5 nm undoped GaAs spacer layer, a 20 nm p-GaAs (Be-doped) (1E17 cm-3) spacer layer, a 25 nm p+-GaAs (Be-doped) (3E18 cm-3) cladding/contact layer, a 64 nm p+ doped (3E18 cm-3) Al0.3Ga0.7As cladding/contact layer, and finally a 10 nm heavily p-doped (1E20 cm-3) GaAs top contact layer.

The top mirror is formed by the GaAs/air or after processing the GaAs/ITO interface. ITO stands for Indium Tin Oxide and is used as a contact material.

| In summary the epitaxial structure is composed of: | | | |
|---|---|---|---|
| 10 nm GaAs:Be | | 1e20 (top) | |
| 64 nm Al.3Ga.7As:Be | | 3e18 | |
| 25 nm GaAs:Be | | 3e18 | |
| 20 nm GaAs:Be | | 1e17 | |
| 5 nm | GaAs | | |
| 8 nm | AlAs | | |
| 5 nm | GaAs | | |
| 20 nm GaAs:Si | | 1e17 | |
| 25 nm GaAs:Si | | 3e18 | |
| 62 nm Al.3Ga.7As:Si 3e18 | | | |
| 71.1 nm | AlAs:Si | | 3e18 |
| 58.2 nm | GaAs:Si | | 3e18 |
| 71.1 nm | AlAs:Si | | 3e18 ---\|*9 |
| 58.2 nm | GaAs:Si | | 3e18 ---\| |
| 500 nm GaAs:Si | | 3e18 (bottom) | |
| | Substrate | | GaAs 2" n-doped |

The 71.1 nm AlAs down to 58.2 GaAs constitutes a Distributed Bragg Reflector. *9 indicates a repetition of the layers.

The doping sequence can be inverted: p-doped substrate, p-doped bottom contact, and n-doped top contact layers.

The above layer structure was designed for electromagnetic radiation emission at 855 nm.

The principle of operation of the electromagnetic radiation emitting device of the present invention is as follows.

Figure 4:
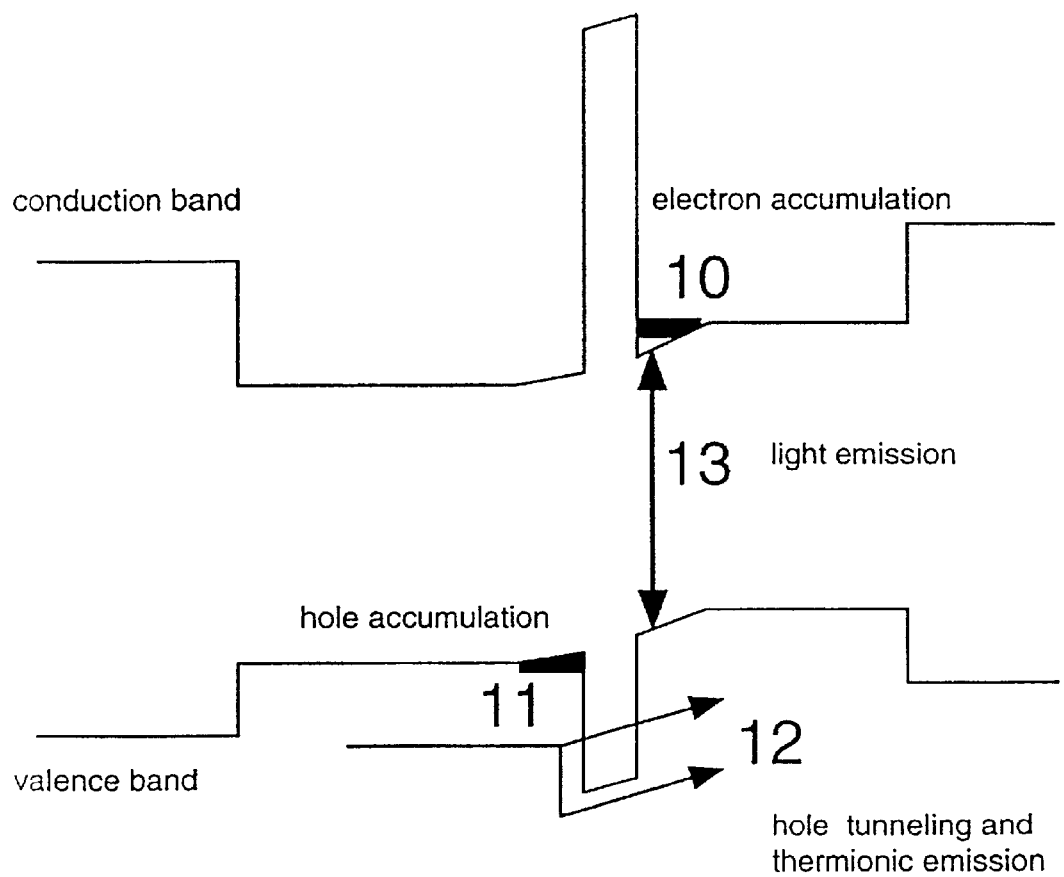
FIG. 4 shows the principle of operation of the electromagnetic radiation-emitting device according to an embodiment of the present invention.

(i) The proposed device structure provides vertical localization of the electromagnetic radiation emission by inclusion of a barrier layer, preferably a single barrier layer. Electrons and holes accumulate on either side of the barrier (10, 11) (see FIG. 4). The electrons form a 2-Dimensional Electron Gas (2DEG) in the accumulation layer. The main source of electromagnetic radiation is assumed to be a recombination (13) that takes place between these electrons and the both thermoionically and by tunnelling (12) injected holes. The use of a 2DEG and the high accumulation in a single 2DEG versus the use of several quantum wells in the state-of-the-art optimizes the microcavity effects as will be apparent from the optical experiments.

(ii) In the electron accumulation layer (10), the quantization energy in the 2DEG is very small, leading to an emission wavelength that shows a negligible dependence on geometry. This creates a substantially constant emission wavelength (in essence the bulk emission wavelength) over a wafer which is not the case when using a quantum-well layer according to the state of the art.

As a result, the electromagnetic radiation emitting device of the present invention achieves very homogeneous efficiency over an epitaxially-grown wafer due to constant bulk emission combined with weakly dependent mirror/cavity change. The efficiency of conventional state-of-the-art electromagnetic radiation emitting devices depends on the thickness of the active layer and the cavity. In addition, the electromagnetic radiation emitting device of the present invention has a low capacitance: the single-barrier allows fast charge separation and leads to ultra-high-speed large signal modulation. Gbit/s modulation has been demonstrated.

Figure 5:
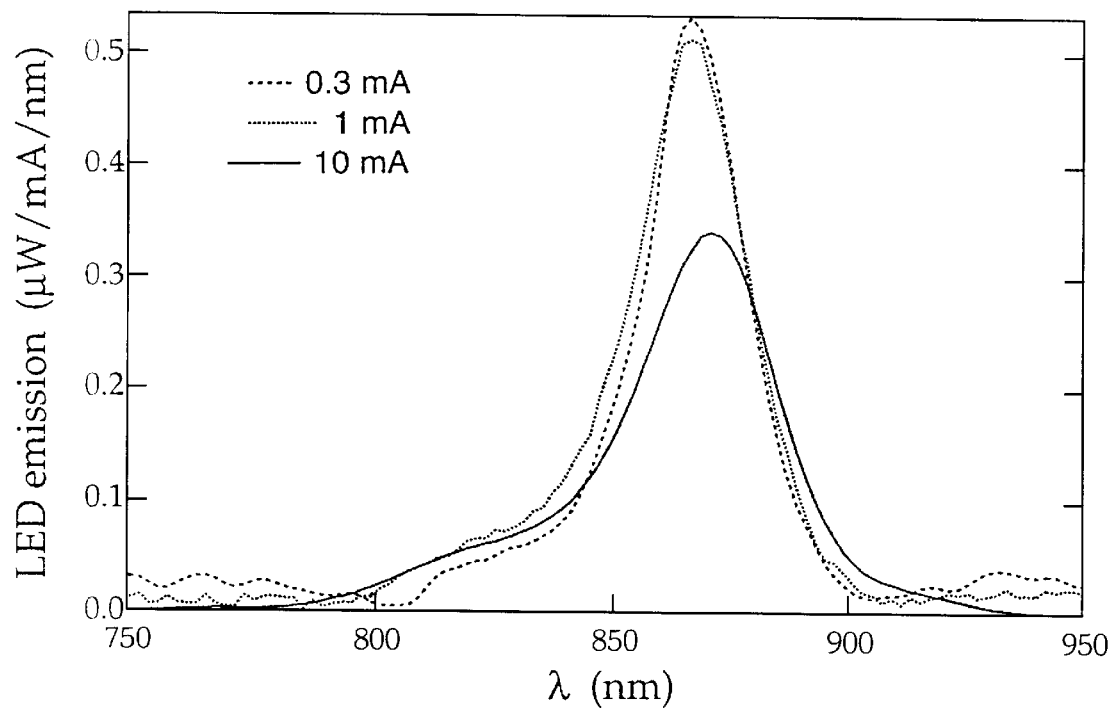
FIG. 5 shows the spectral optical output for several drive currents for the electromagnetic radiation-emitting device according to an embodiment of the present invention.
Figure 6:
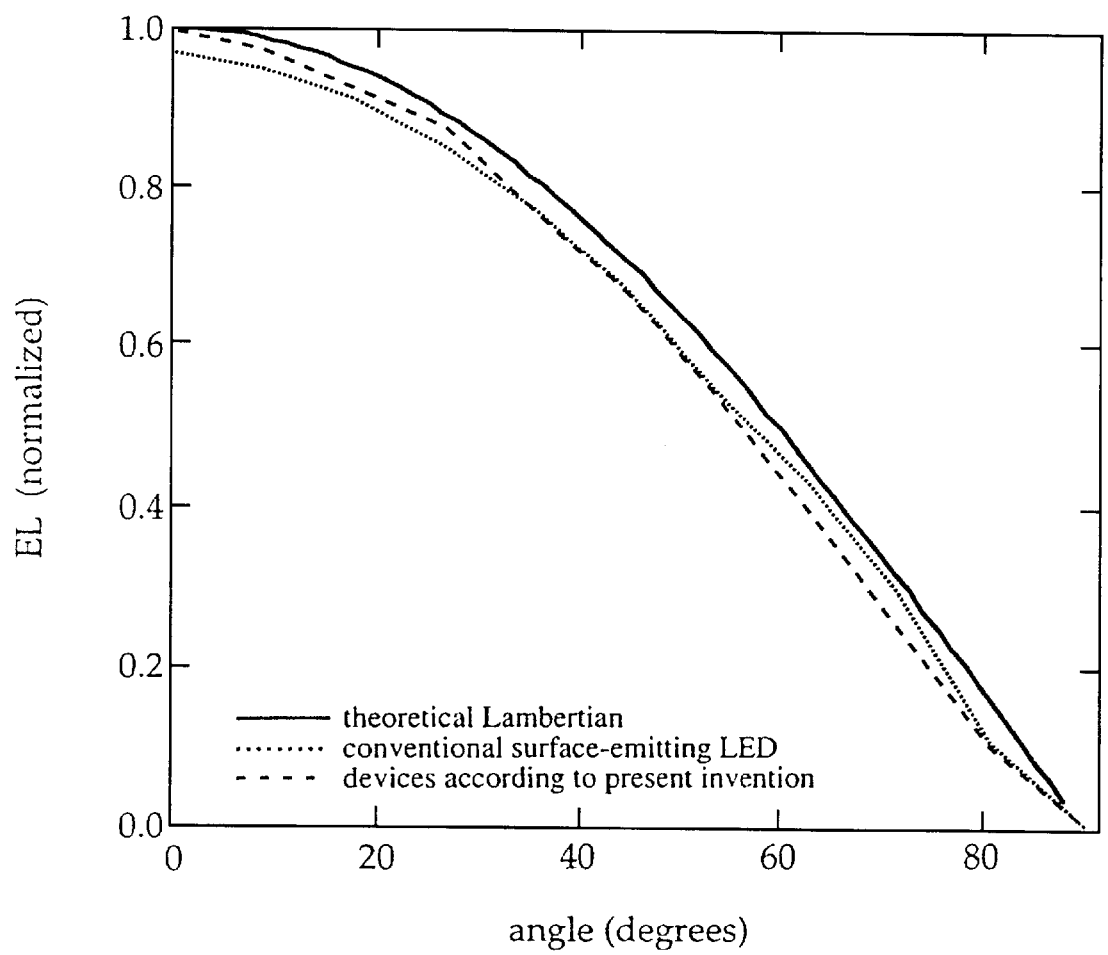
FIG. 6 shows the angular distribution of the emitted electromagnetic radiation of the electromagnetic radiation-emitting device according to an embodiment of the present invention.

The Optical characteristics of the electromagnetic radiation-emitting device according to the present invention are as follows: under forward bias, the device emits electromagnetic radiation at the cavity wavelength (855 nm in the example). Because of the low reflectivity of the top mirror (by using the air/ITO interface as a top mirror), the angular distribution of the emitted electromagnetic radiation is still Lambertian and spectral narrowing is also not observed. The optical spectra for several drive currents (0.3 mA, 1 mA and 10 mA) are shown in FIG. 5. Line widths of the emitted electromagnetic radiation of the electromagnetic radiation emitting device according to the present invention are 25 nm and saturation effects are not observed. Line width broadening is also very small. The angular distribution of the emitted electromagnetic radiation is shown in FIG. 6. The emission is purely Lambertian, identical to a conventional LED. For comparison, the angular distribution of a reference standard LED is measured and plotted in FIG. 6 as well as the calculated Lambertian line shape.

Figure 7:
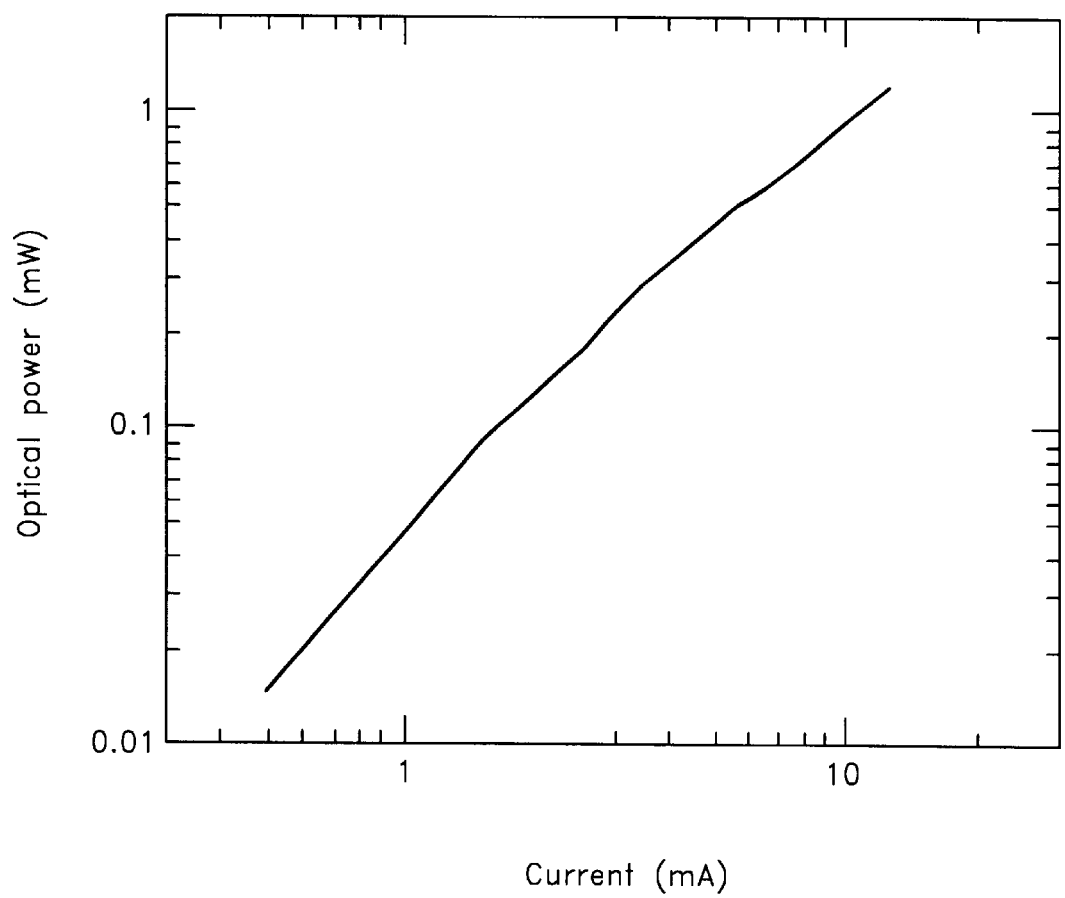
FIG. 7 shows the optical power output versus electrical drive current of the electromagnetic radiation-emitting device according to an embodiment of the present invention.

The optical power output of the device of the example was measured using a calibrated optical power meter at a given distance from the electromagnetic radiation emitting device according to the present invention thereby collecting a calibrated fraction of the total power. The total power is plotted versus DC\drive current in FIG. 7. From the optical power follows the external quantum efficiency $$\eta = \frac{P_{opt}}{I_{drive} * E_{photon}}$$

The external quantum efficiency amounts to 8% for the electromagnetic radiation-emitting device of the present invention in good agreement with the simulated value of 9% for the given device layer structure.

The speed of the device according to the example of the present invention is measured by large signal modulation. Electrical pulses from 0V to 3V forward bias with 60 ps rise time and 120 ps fall time were applied and the optical response was measured. Optical collection used either a 1 GHz Hamamatsu optical detector in combination with a 2.5

Figure 8:
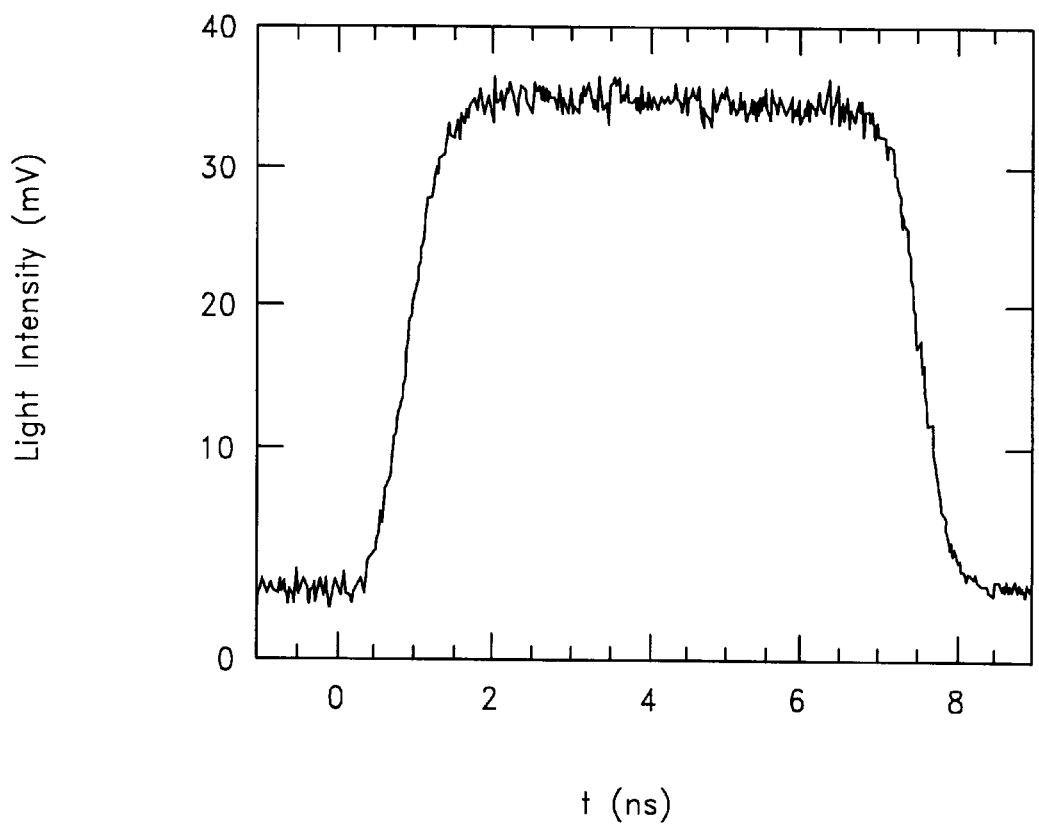
FIG. 8 shows the optical response versus time for the electromagnetic radiation-emitting device according to an embodiment of the present invention.
Figure 9:
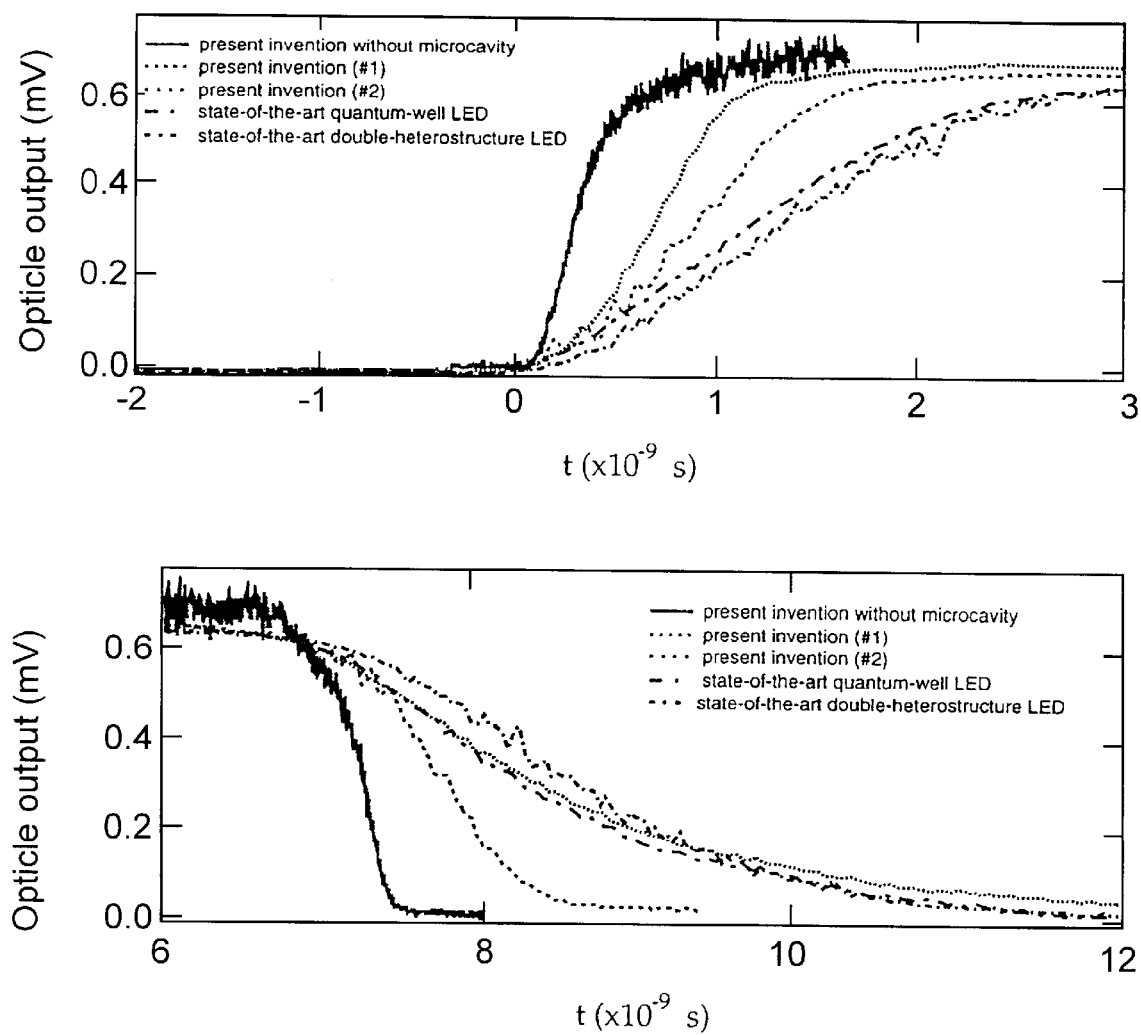
FIG. 9 compares the transient response of the electromagnetic radiation-emitting device according to the present invention and state-of-the art LEDs. The devices of the present invention have nominally identical layers, nominally identical quantum efficiency, but have different ITO contacts. The characteristics of a conventional GaAs quantum well LED without microcavity and of a conventional double-heterostructure LED without quantum well and without microcavity.

GHz Tektronix digitizing oscilloscope or a Hamamatsu streakscope (25 ps timing resolution). The optical response is shown in FIG. 8. The 10–90% rise and fall times amount to 800 ps, from which a 3 dB frequency of 0.6 GHz is derived. The rise and fall times are four times shorter than conventional LEDs which have been tested for comparison (see FIG. 9).

Tunnelling LEDs without $\mu$ cavity were made for comparison and show rise and fall times of only 180 ps, corresponding to a 3 dB frequency of 2.2 GHz. The present limitation of the devices of the present invention is thought to be due to the large contact resistance of the ITO-GaAs contact, which was not used for the tunnelling LEDs without the $\mu$ cavity.

Figure 10:
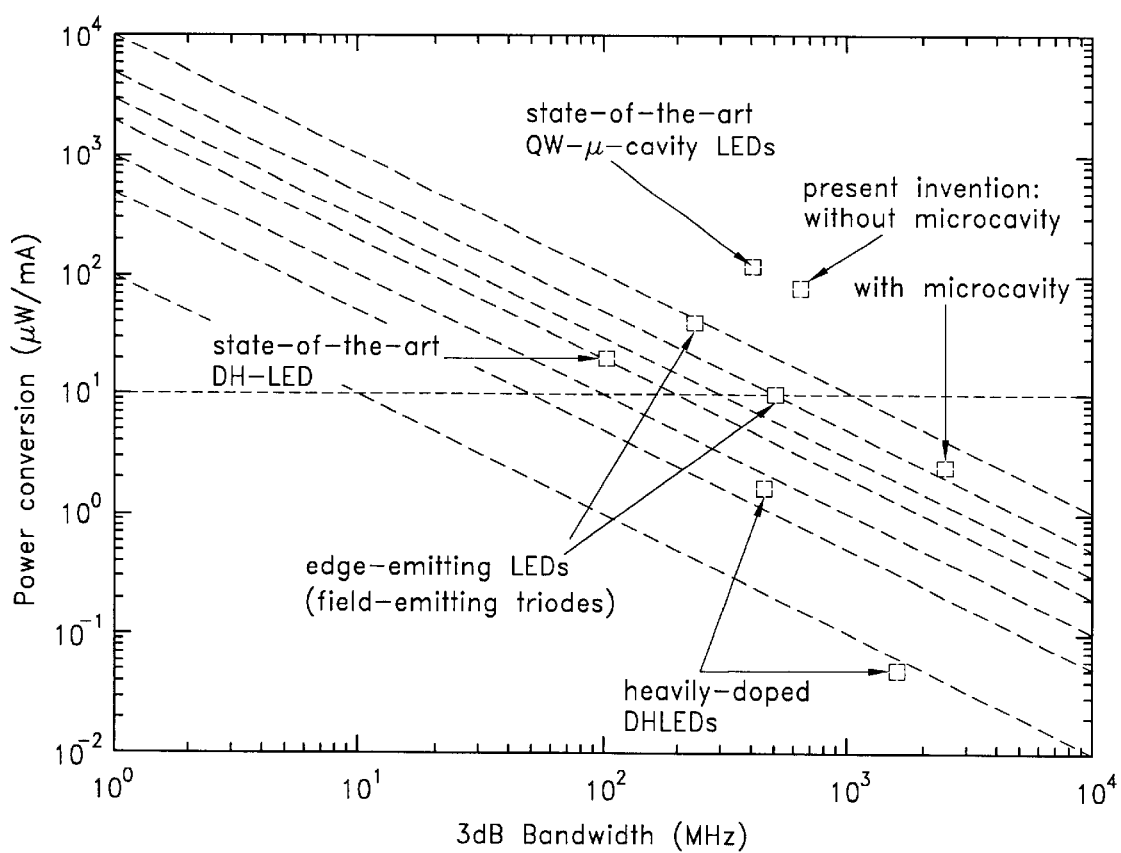
FIG. 10 shows a comparison of the power to electromagnetic radiation conversion efficiency of the electromagnetic radiation-emitting device of the present invention with state-of-the-art semiconductor based electromagnetic radiation emitting devices.

FIG. 10 illustrates a comparison of the power to electromagnetic radiation conversion efficiency of devices made in accordance with the present invention with state-of-the-art semiconductor based electromagnetic radiation emitting devices.

The electromagnetic radiation emitting device of the present invention can be used for short-distance telecommunication applications or general display applications.

Another application can be in a system for providing an optical interconnect between two chips. The system is a basic building structure for parallel optical interconnects between chips. Image fibers, well know from medical imaging, and used, among others places in endoscopes, transport an image from one place to another with a one to one correlation between light input and light output image. Arrays of electromagnetic radiation emitting devices can be spaced very densely, in arrays on a pitch of 50 micron or even less. Such an array of electromagnetic radiation emitting devices forms together with an image fiber a basic structure for a parallel optical interconnect. By abutting the image fiber even without lenses or tapers to the array of electromagnetic radiation emitting devices being integrated on for instance a CMOS chip, a parallel optical interconnect is formed. The signals being generated in this chip are transmitted through the array of electromagnetic radiation emitting devices to a second chip. Glue or adhesive forms a means to fabricate a solid construction. The person skilled in the art of chip-packaging knows which glue can be used, and how alignment can be obtained. The electromagnetic radiation emitting devices of the present invention are bonded on the CMOS chip and the electrical signals generated in the CMOS chip trigger the electromagnetic radiation emission of one or a plurality of the electromagnetic radiation emitting devices of the array. The emitted electromagnetic radiation is transmitted through the image fiber and is detected in an optical thyristor or a CMOS based detector being bonded or integrated in the second chip.

What is claimed is:

1. A method of producing a device for emitting electromagnetic radiation, comprising:

depositing a first layer including a first material with a first bandgap and having a refractive index $n_1$ and with charge carriers of a first conductivity type on a substrate;

depositing a second layer of a second material with a second bandgap on said first layer, said second bandgap being larger than said first bandgap; and depositing a third layer of substantially the same thickness as said first layer on said second layer, said third layer being provided with charge carriers of a third conductivity type, the total thickness of said first and said third layers having a value of about a predetermined wavelength of radiation emitted by said device divided by $n_1$;

while maintaining during said depositing at least one surface of said first layer and one surface of said third layer essentially parallel.

2. The method as recited in claim 1, further comprising the step of depositing a mirror layer on said substrate.

3. The method as recited in claim 1, wherein said steps of depositing said layers comprise the steps growing said layers epitaxially on said substrate.

4. The method as recited in claim 3, wherein said substrate is composed of said first material.

* * * * *